(12) United States Patent
Yokogawa et al.

(10) Patent No.: US 7,255,775 B2
(45) Date of Patent: Aug. 14, 2007

(54) SEMICONDUCTOR WAFER TREATMENT MEMBER

(75) Inventors: Masanari Yokogawa, Yamagata (JP);
Hirotaka Hagihara, Yamagata (JP);
Shinya Wagatsuma, Yonezawa (JP);
Koutarou Kitayama, Yamagata (JP);
Chieko Fujiwara, Yamagata (JP)

(73) Assignee: Toshiba Ceramics Co., Ltd., Tokyo (JP)

( * ) Notice: Subject to any disclaimer, the term of this patent is extended or adjusted under 35 U.S.C. 154(b) by 255 days.

(21) Appl. No.: 10/603,781

(22) Filed: Jun. 26, 2003

(65) Prior Publication Data
US 2004/0089236 A1 May 13, 2004

(30) Foreign Application Priority Data
Jun. 28, 2002 (JP) ............................ 2002-191356

(51) Int. Cl.
*H01L 21/306* (2006.01)
*C23C 16/00* (2006.01)

(52) U.S. Cl. .................................. 156/345.51; 118/728

(58) Field of Classification Search ................ 118/728, 118/729, 730, 723 R; 156/345.51, 345.52, 156/345.53
See application file for complete search history.

(56) References Cited

U.S. PATENT DOCUMENTS

| 5,460,684 A | * | 10/1995 | Saeki et al. ............ 156/345.51 |
| 2004/0060512 A1 | * | 4/2004 | Waldhauer et al. ......... 118/715 |
| 2004/0218340 A1 | | 11/2004 | Kitabayashi et al. |

FOREIGN PATENT DOCUMENTS

EP          1 191 581 A1          3/2002

* cited by examiner

Primary Examiner—Luz Alejandro-Mulero
(74) Attorney, Agent, or Firm—Foley & Lardner LLP

(57) ABSTRACT

There is provided a semiconductor wafer treatment member in which the occurrence of slippage thereof is prevented and which has an adequate cohesiveness onto the semiconductor wafer and an excellent durability. The semiconductor wafer treatment member A of the present invention has at least a surface formed with a silicon carbide (SiC) film thereon, comprising a support portion for receiving a semiconductor wafer, said support portion being composed of salients with which said semiconductor wafer substantially comes into contact; and depressions formed with the silicon carbide (SiC) film to provide a coverage area between said salients, said salients being formed with top surfaces having a surface roughness Ra of 0.05 μm to 1.3 μm.

5 Claims, 3 Drawing Sheets

PRIOR ART

PRIOR ART

SEMICONDUCTOR WAFER TREATMENT MEMBER

BACKGROUND OF THE INVENTION

1. Field of the Invention

The present invention relates to a semiconductor wafer treatment member consisting of only a silicon carbide (SiC film) film thereon, or on the surface of the substrate having a silicon carbide film thereon, in other words, at least on the surface thereof and more particularly to a semiconductor wafer treatment member used as components in a jig for treating semiconductors such as wafer boards, susceptors, etc.

2. Description of the Related Art

In the process of the semiconductor manufacturing, it is a widely followed procedure to form a silicon nitride ($Si_3N_4$) or poly silicon thin film on the surface of semiconductor wafer. As a jig used to work on wafer boards for such thin film forming process, a quartz glass jig, or a jig having only a silicon carbide (SiC) film or a silicon carbide (SiC) film formed on carbon-impregnated, SiC-impregnated or SiC surfaces is used.

Such jigs composed of a semiconductor wafer treatment member having a SiC film formed on at least the surface thereof are widely used in CVD devices operated at a high temperature because of their better heat resistance cycle characteristics, better thermal shock resistance as compared to the quartz glass jig.

The film forming methods for obtaining a semiconductor wafer treatment member having a silicon carbide (SiC) film thereon on the surface thereof include (1) a method in which raw material gases of silicon and carbon origins are introduced into the reactor from outside to be heated at a normal pressure or a reduced pressure; or (2) a method in which, for the substrate being made of carbon, a raw material gas of silicon origin is introduced into the reactor from outside to be heated at a normal pressure or a reduced pressure.

The silicon carbide (SiC) film formed by chemical vapor deposition as discussed above is formed with serrations in the surface thereof. Although random in size, said serrations are formed of part of sharp crystal grains. FIGS. 4 and 5 provide general views thereof; FIG. 4 is an explanatory plan view and FIG. 5 is an explanatory view in cross section of the surface thereof. It is to be noted that the black areas show depressions while the white areas show salients.

In FIG. 5, the character B denotes a substrate of for example carbon with a CVD silicon carbide (SiC) film C. Further, said silicon carbide (SiC) film has salients 1 formed with serrations having sharp edges 1 which are part of crystal grains.

When the semiconductor wafer treatment member having this surface as described above is used for semiconductor wafer manufacturing, the serrations having sharp salients 1 generate mechanical or thermal stresses to cause the semiconductor wafer to be flawed or slippery.

In order to solve this problem, the (top) surface of the silicon carbide film (SiC film) is subjected to grinding on the machine platen after formation of the silicon carbide film to remove said edges of the serrations and obtain a mirror surface. The explanatory view of an obtained surface is shown in FIG. 6, which is a cross section to show the surface state thereof.

In this way, the silicon carbide (SiC) film polished into a mirror surface shows a strong contact characteristic to such an extent that the semiconductor wafer adheres to the silicon carbide film to give rise to a problem that the semiconductor wafer adheres to the silicon carbide when the semiconductor wafer placed there is to be taken out. Therefore, the semiconductor wafer is subjected to blasting after the grinding operation in order to have an optimum cohesion characteristic against the semiconductor wafer. In order to realize this purpose, the optimum irregularities are formed after the mirror surface grinding.

It is to be noted that said silicon carbide (SiC) film polished into a mirror surface undergoes mechanical external force at the entire surface thereof due to the grinding on the machine platen.

Further, the silicon carbide (SiC) film subjected to blasting after the mirror grinding to form an optimum irregularities receives a mechanical external force at the entire surface thereof.

The surface of the silicon carbide (SiC) undergoing such mechanical force from outside has minute microcracks especially in the grain boundary of the SiC crystal as well as damaged portions unobservable by visual check. Consequently, if the semiconductor wafer is subjected to the dry washing by oxygen baking or the like or the wet washing by hydrogen fluoride (HF) or the like prior or subsequently to the semiconductor wafer treatment, the degradation of said silicon carbide (SiC) film starts from said microcracks or cracks accompanying the growth of the damage, providing contributing factors of shortening of the service life of the semiconductor treatment member. Further, such cracks, once formed, give rise to problems that the substrate emits gases containing impurities such as carbon monoxide or carbon hydride, contaminating the semiconductor wafer to be treated.

SUMMARY OF THE INVENTION

The inventors made intensive research work on the surface conditions of the silicon carbide (SiC) film to find that minute microcracks, damage or wafer contamination are reduced if the surface of the silicon carbide (SiC) film is at a certain state while providing a longer service life to the semiconductor wafer treatment member as well as obtaining an optimum cohesiveness characteristic against the semiconductor wafer with the result that the present invention is made.

Therefore, the object of the present invention is to provide a semiconductor wafer treatment member which helps restrain slippage of semiconductor wafers while obtaining an optimum cohesiveness characteristic against the semiconductor wafers.

The present invention was made to accomplish the above discussed object and the semiconductor wafer treatment member claimed in the present invention has a silicon carbide (SiC) film formed on at least a surface thereof, in which there is provided a support portion to receive a semiconductor wafer thereon, said support portion is formed with salients with which said semiconductor wafer substantially comes into contact; and depressions formed with said silicon carbide (SiC) film to provide a coverage area between said salients, said salients being formed with top surfaces having a surface roughness Ra of 0.05 µm to 1.3 µm (JIS B 0601-1994).

The semiconductor wafer treatment member of the present invention is characterized as discussed above in that there are formed therein salients with which said semiconductor wafer substantially comes into contact; and depressions formed with the silicon carbide (SiC) film to provide a coverage area between said salients. Since the depressions has surfaces between the salients and the film is formed to cover said surface, any formation of minute microcracks is restrained in the surface of the silicon carbide (SiC) film over the support portion on which a semiconductor wafer is to be supported, particularly in the grain boundary of the silicon carbide (SiC) crystal. Similarly, flaws unobservable by visual check may be restrained.

As a result, even if the member is subjected to dry washing by such as oxygen baking or wet washing by such as hydrogen fluoride (HF) prior to or subsequent to the semiconductor wafer treatment, the silicon carbide (SiC) film is free from deterioration and has an excellent durability since the formation of microcracks or flaws is restrained. Further, the generation of gases as impurities such as carbon monoxide gas or carbon hydride gas from the substrate is restrained, the contamination of the semiconductor wafer may be prevented. Moreover, since the surface roughness Ra of the top surfaces of the salients with which the semiconductor wafer comes into contact is 0.05 µm to 1.3 µm, the required adequate cohesiveness against the semiconductor wafer is assured.

Then, it is preferable in the present invention that the area of the surfaces of the depressions is 20 to 90% of the total area if taken at a predetermined range viewed vertically from above the support portions. If the surface of the depressions cover an area of 20% or more, the durability thereof is particularly outstanding such that the service life of the semiconductor wafer formed on the semiconductor wafer treatment member, particularly that of a susceptor formed with the silicon carbide (SiC) film thereon is double-folded.

Furthermore, if the area of the film formed on the surface thereof is kept 90% or less, it is possible to reduce the risk of slippage often observed when the semiconductor wafer is caused to come into contact with the sharp edges of part of the crystalline particles present in the depressions formed with a film accompanying the thermal deformation of the semiconductor wafer.

Further, it is preferable that the surface roughness Ra (JIS B 0601-1994) is 3 µm or more when measured for the length of 300 µm.

In this way, since the surface roughness of Ra is 3 µm or more when measured for the length of 300 µm over said silicon carbide (SiC) film, the deformation of said semiconductor wafer is restrained. If the surface roughness measured for a length of 300 µm is less than 3 µm or less, the heat transmission from the semiconductor treatment member increases with the result the underside of the wafer is subjected to quicker heating to cause the curling of the semiconductor wafer. The surface roughness Ra is preferably 6 µm or more when measured for a length of 300 µm in the depressions because it is possible to reduce the occurrence of the semiconductor curling.

Further, the present invention is preferably formed with curved boundary portions connecting the top surfaces of said salients and the surface of the depressions. Thus, said boundary portions come into contact with the thermally deformed semiconductor wafer to prevent the risk of possible slippage.

DESCRIPTION OF THE PREFERRED EMBODIMENTS

Hereinafter, the semiconductor wafer treatment member according to the present invention will be explained specifically with reference to FIG. 1 and FIG. 2.

Figure 1:
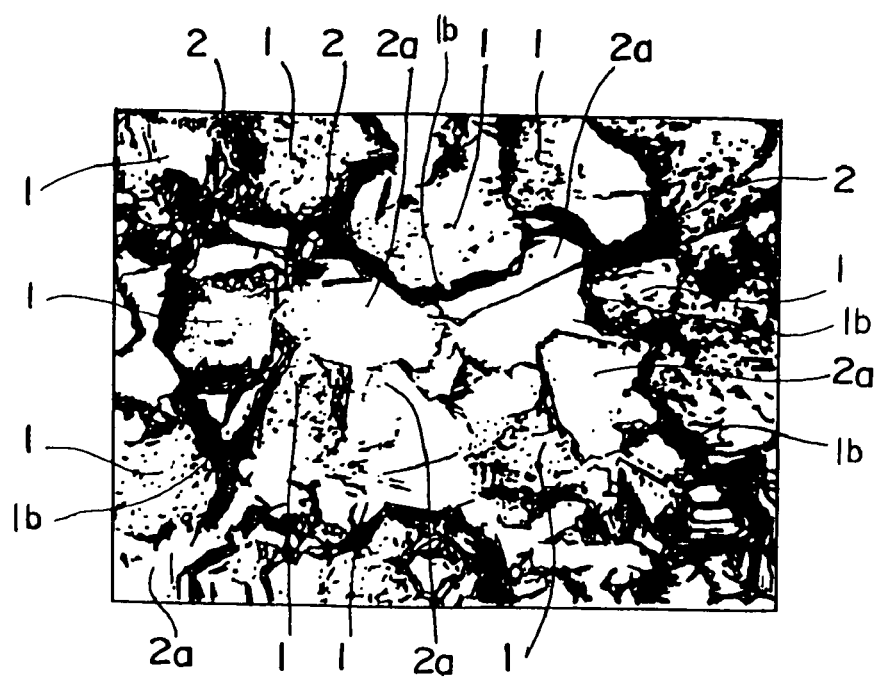
FIG. 1 is a plan view typically showing the surfaces of the silicon carbide (SiC) film on the semiconductor treatment member according to the present invention.
Figure 2:
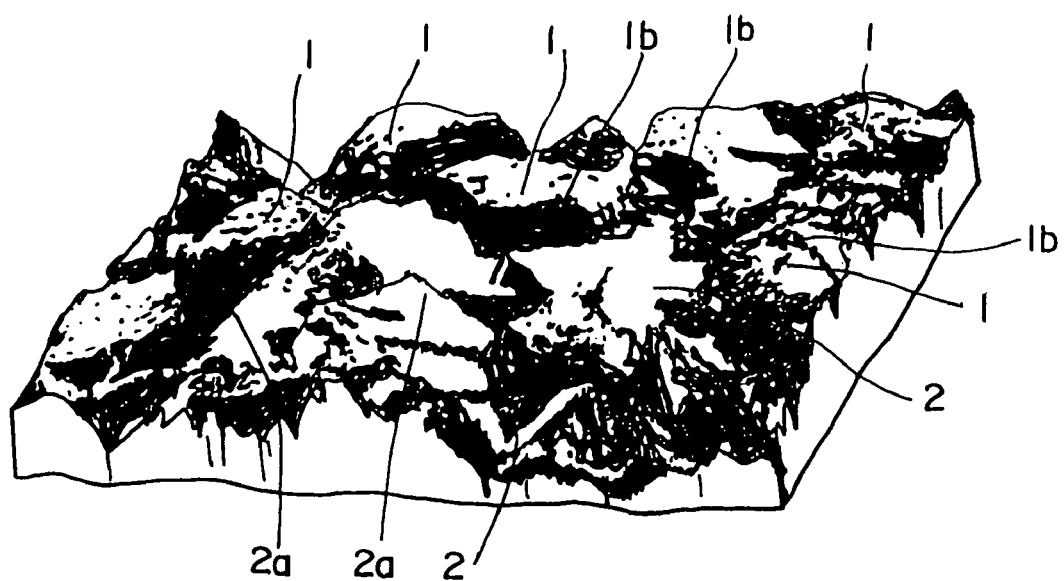
FIG. 2 is a perspective view typically showing the surfaces of the silicon carbide (SiC) film on the semiconductor treatment member according to the present invention.
Figure 3:
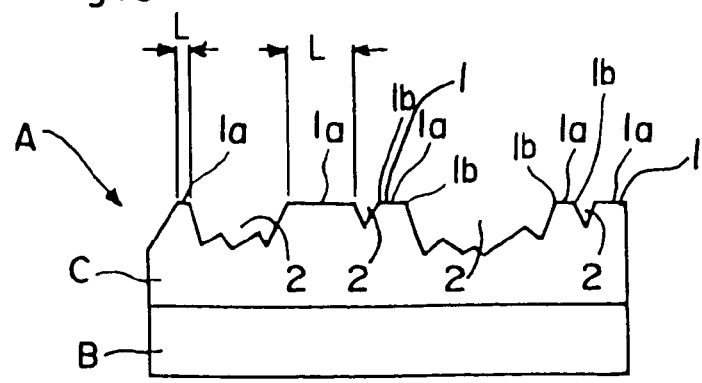
FIG. 3 is a cross sectional view typically showing the surfaces of the silicon carbide (SiC) film on the semiconductor treatment member according to the present invention.
Figure 4:
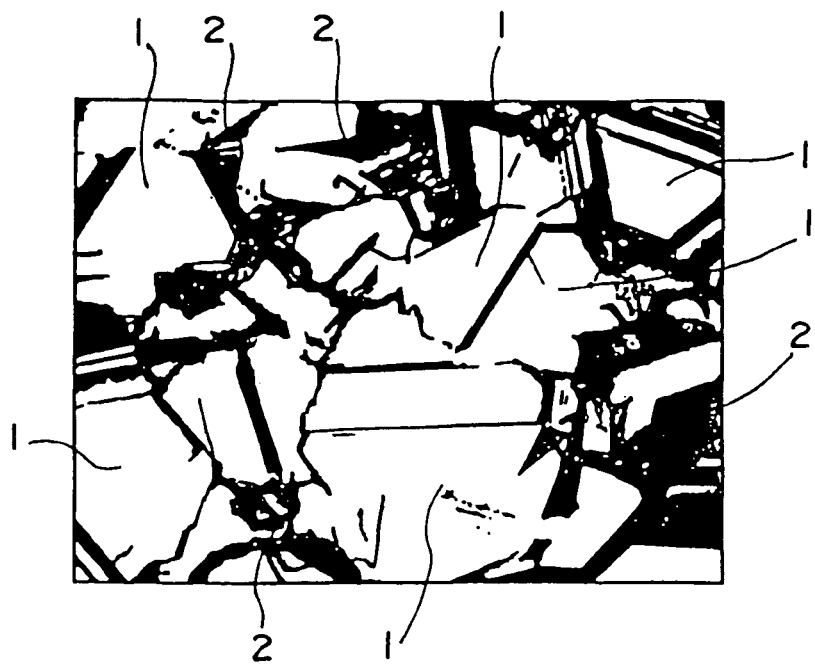
FIG. 4 is a plan view typically showing the surfaces of the silicon carbide (SiC) film formed by the chemical vapor deposition.

FIG. 1 is a plan view typically showing the surface of the silicon carbide (SiC) film on the semiconductor wafer treatment member, FIG. 2 is a perspective view typically showing the same, and FIG. 3 is a cross sectional view typically showing the same.

Said semiconductor wafer treatment member A is composed of a carbonaceous substrate B and a silicon carbide (SiC) film C formed on a surface thereof. Said semiconductor wafer treatment member A is provided with a support portion on which a semiconductor wafer is received, said support portion having salients 1 with which the semiconductor wafer comes into actual contact and depressions 2 which retain a filmy surface formed between the salients.

It is to be noted in this connection that the "actual contact" of said semiconductor wafer refers to the semiconductor wafer being subject to thermal or mechanical deformation while in contact with the support portion.

In plan view of a predetermined area (specifically 200 µm×300 µm) taken from above said support portion, it is designed such that said depressions 2 covers 20 to 90% of the total area of said support portion. For example, it is 80% in FIG. 1.

In particular case of said depressions 2 covering 20 to 70% of the total area, the surface of the semiconductor wafer will usually not come into contact with the surfaces 2a of the depressions even if there is a thermal or mechanical deformation, thus obtaining a preferable result.

Further, said salients 1 are grinded to form flat top surfaces 1a; that is, the sharp edges of the salients 1 (which are SiC crystals) are grinded flat. It is to be noted that the top surfaces extend in the range of L shown in FIG. 3, said the range of L alone having been worked while the rest is to be defined to be depressions.

Figure 6:
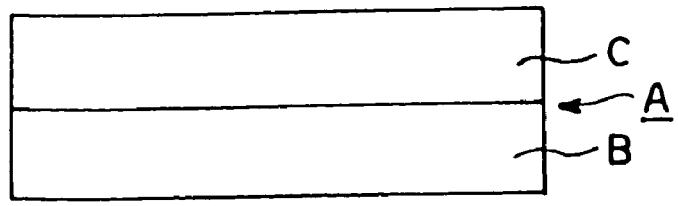
FIG. 6 is a cross sectional view typically showing the surfaces of the silicon carbide (SiC) film formed by the chemical vapor deposition and having said surfaces polished into a mirror surface.

Further, the top surfaces 1a of the salients 1 have surface roughness Ra of 0.05 to 1.3 µm It is to be noted it is not that said grinding is continued until the entire surface of the semiconductor wafer treatment member is polished into a mirror surface as shown in FIG. 6 but the grinding is finished at the time when a predetermined ratio of the depressions 21 which are covered with a film between the salients remains as described later. In other words, some areas in the depressions between the salients 1 have SiC crystal serrations 2 retaining surfaces thereof at levels lower than the top surfaces 1a of said salients 1. It is to be noted in this connection that although the boundary portions 1b connecting the top surfaces 1a of the salients 1 and the surfaces of the depressions 2 are shown as sharp edges in FIG. 3, said boundary portions 1b are defined in a curved form.

Further, only said surfaces 2a of the depressions 2 are subjected to a surface roughness measurement at an area horizontally extending over a length of 300 μm to determine the surface roughness of 3 μm or more.

Figure 5:
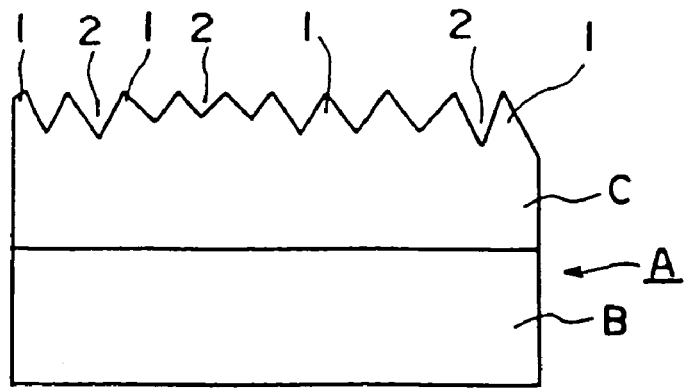
FIG. 5 is a cross sectional view typically showing the surfaces of the silicon carbide (SiC) film formal by the chemical vapor deposition.

In other words, only the sharp peaks of SiC crystal in the semiconductor wafer treatment member A shown in FIG. 5 are subjected to grinding such that the top surfaces 1a with which a semiconductor wafer is brought into actual contact are made flat while the surfaces of the depressions 2 are left as they are covered with a film.

This way of grinding assures that little external force is exerted onto the silicon carbide (SiC) grain boundary and, if any, it is less than in the prior art. As a result, it has been made possible to restrain the generation of minute microcracks so far observed in the silicon carbide (SiC) film on the support portion for the semiconductor wafer, particularly in the cross section of crystal grains (in the top surfaces 1a) subject to mechanical force from outside while being ground. Further, flaws which cannot be confirmed in a visual observation can also be restrained.

Therefore, the restraint of flaws such as said microcracks assures that the degradation and detachment of the silicon carbide (SiC) film are prevented to give thereto a distinguished durability even if said semiconductor wafer treatment member A is subjected to dry cleaning such as oxygen baking or wet cleaning such as hydrogen fluoride (HF) cleaning. Further, the restraint of crack formation assures the prevention of carbon mono oxide gas, carbon hydride gas from the substrate B if made from carbonaceous material, thus preventing contaminations from semiconductor wafers.

Further, the surface roughness of the top surfaces 1a of the salients with which the semiconductor wafer is actually come into contact as stated above is within the range of 0.05 μm to 1.3 μm assures the adequate cohesiveness against semiconductor wafer.

In other words, if the surface roughness Ra of the top surfaces 1a of the salients 1 is less than 0.05 μm, the top surfaces can be extremely flat to such an extent that the semiconductor wafer tends to adhere to the silicon carbide film. On the other hand, said surface roughness exceeds 3 μm makes the top surfaces 1a of the salients 1 so conspicuous that the surface of the semiconductor wafer is susceptible to mechanical damage. Therefore, it is preferable to have the surface roughness Ra at the level of 0.05 to 1.3 μm.

It is to be noted that said surface roughness obtained by the abrasion of the silicon carbide film makes the cohesiveness of the semiconductor wafer adequate such that the blast treatment so far conducted may be omitted.

Further, it is preferable that the area occupied by said depressions 2 is in the range of 20 to 90% of the total area of the member in a plan view observation of the predetermined are viewed from above the support portion.

Said area of the surfaces 2a of the depressions 2 being 20% or more makes the above mentioned durability remarkable such that the service life of semiconductor wafer members, particularly as a susceptor formed with a silicon carbide (SiC) film on the surface of the carbonaceous substrate is increased to two times or more.

Further, by making the area of said surfaces of the depressions 90% or less, said semiconductor wafer comes into contact with the tips of the crystal particles present as part thereof in the depressions formed with a film is formed into sharp projections as a result of the thermal deformation such that the risk of the slippage of the semiconductor wafer is lowered.

Further, it is preferable in the present invention that the surface roughness (Japanese Industrial Standards B 0601-1994) of said surfaces of the depressions is 3 μm or more when the measured length is 300 μm.

By this way, the surface roughness Ra of 3 μm or more when measured over the length of 300 μm or more for example 500 μm over the surface of the silicon carbide film assures the reduction of the semiconductor wafer deformation.

The surface roughness Ra of 3 μm or less as measured over the length of 300 μm allows a larger radiation heat transmission from the semiconductor wafer treatment member to make the underside of the wafer subject to quicker heating as compared to the upper side thereof with the result that the semiconductor wafer is curled. The surface roughness Ra of 6 μm or more as measured over the length of 300 μm in the depressions is more preferable because the curling of the semiconductor wafer as observed will be reduced.

Further, the boundary portion connecting the top surface 1a of the salients 1 and the surface 2a of the depressions 2 are preferably curved. By this design, the risk of slippage due to contact of the semiconductor wafer undergoing a thermal deformation with said boundary portion 1b is minimized.

Further, with the boundary portion connecting the top surface 1a of the salients 1 and the surface 2a of the depressions 2 being curved, the mechanical damage to the semiconductor wafer by said boundary portion 1b is restrained. It is to be noted that a curved boundary portion is preferably worked with large sized crystal particles in the silicon carbide film when grinding the silicon carbide (SiC) film.

EXAMPLES

The present invention will be further explained with reference with the embodiments although the present invention will not be limited to the following embodiments.

Example 1

A silicon carbide (SiC) film was chemically deposited on the isotopic carbonaceous substrate prepared in the form of a susceptor provided with a plurality of support portions having a curved surface hollow ground. This vapor deposition is performed by a generally known method admitting a raw material gas into a reactor as a source of silicon to be heated under reduced pressure.

More specifically, a substrate to be treated is located at a reaction zone in the reactor with reduced pressure maintained at 20 to 0.1 Torr at a temperature of 1600 to 1800° C. before a silicon monoxide gas was introduced into the reactor to chemically form a silicon carbide (SiC) film on the substrate surface. It is to be noted that the crystal particles forming said silicon carbide film have sizes ranging from 30 μm to 180 μm.

The wafer support portion of the susceptor is provided with cushioning between the grinder and the grinding stone, said grinding stone being subjected to abrasion by means of a rotary grinder composed of sectors each having a predetermined area to obtain a susceptor formed with a silicon carbide (SiC) film having a surface roughness of Ra 0.05 μm on the top surfaces of the salients. It is to be noted that the area of the convex portion which said semiconductor wafer will not actually contact is designed to be 30% of the total area in a plan view observation of the predetermined range seen vertically from above the support portion. Further, the surface roughness of the surfaces of said depressions was found to be Ra=10 μm for measurement length of 500 μm.

Then, semiconductor wafers were placed on the susceptor to be incorporated into an epitaxial growth device, where 100 such semiconductor wafers were treated to count the number of slips formed in said semiconducotor wafers, the number of semiconductor wafer caused to adhere to the silicon carbide film, the number of the semiconductor film having defects in the undersides thereof, and the number of the rejected products due to curls. The results will be shown in Table 1.

It is to be noted that the treatments in the epitaxial growth device were conducted at a treatment temperature of 1100° C., under the pressure of 25 Torr, with a gas flow of $SiCl_4/H_2$ gas and for one hour.

Further, a corrosion resistance test was conducted for the susceptor of the first embodiment. This test was conducted at a temperature of 1400° C., at a pressure of 10 Torr, with a flow of $HCl/H_2$ gas and for one hour. The result will be shown in Table 1.

Example 2

The wafer support portion of a susceptor prepared by a step similar to Example 1 is subjected to abrasion by means of a rotary grinder to obtain a susceptor formed with a silicon carbide (SiC) film having a surface roughness Ra of 0.38 μm on the top surfaces 1a of the salients. It is to be noted that the ratio of the area to said depressions is 60% while the surface roughness is equal to that in Example 2.

Then, measurements are conducted under the same condition as in Example 1. The results are shown in Table 1.

Example 3

The wafer support portion of a susceptor prepared by a step similar to Example 1 is subjected to abrasion by means of a rotary grinder to obtain a susceptor formed with a silicon carbide (SiC) film having a surface roughness Ra of 1.3 μm on the top surfaces 1a of the salients. It is to be noted that the ratio of the area to said depressions is 60% while the surface roughness is equal to that in Example 1.

Then, measurements are conducted under the same condition as in Example 1. The results are shown in Table 1.

Example 4

A susceptor having a surface roughness Ra of 0.39 μm on the top surfaces 1a of the salients 1 is obtained as in Example 2 except trichlorosilane is used as a silicon source at a temperature of 1,100 to 1,250° C. and under a reduced pressure of 50 to 30 Torr at the time of SiC film formation. It is to be noted that the ratio of the area to the depressions is 60% while the surface roughness Ra is 0.7 μm for measurement length of 500 μm.

Comparative Example 1

The wafer support portion of a susceptor prepared by a step similar to that in Example 1 is subjected to abrasion by means of a rotary grinder to obtain a susceptor formed with a silicon carbide film and having a substantially mirror surface with the top surfaces 1a of the salients 1, said silicon carbide surface having a surface roughness Ra of 0.01 μm. Then, measurements were conducted under substantially the same condition as in Example 1. The results are shown in Table 1. It is to be noted that the ratio of the area to the depressions is 60% and the surface roughness of the depressions is the same as that in Example 1.

Comparative Example 2

The wafer support portion of a susceptor prepared by a step similar to that in Example 1 is subjected to abrasion by means of a rotary grinder. The obtained susceptor is formed with a silicon carbide film and having a substantially mirror surface with the top surfaces 1a of the salients 1, and said silicon carbide surface has a surface roughness Ra of 1.8 μm. Then, measurements were conducted under substantially the same condition as in Example 1. The results are shown in Table 1. It is to be noted that the ration of the area to the depressions is 60% and the surface roughness of the depressions is the same as that in Example 1.

Comparative Example 3

The wafer support portion prepared by a step similar to that in Example 1 is put to use as a susceptor without being subjected to abrasion and then measurements were conducted under the same condition as in Example. The results are shown in Table 1.

Comparative Example 4

The entire wafer support portion formed in a step similar to that in Example 1 is subjected to sandblasting finish by use of silicon carbide (SiC) particle to obtain a susceptor with the front face of said support portion having a surface roughness Ra of 0.6 μm as a result of external force implied thereto. The results are shown in Table 1.

TABLE 1

|  | Top surfaces of salients Ra (μm) | Slippage pcs per 100 pcs | Adhered piecs pcs per 100 pcs | Damaged pieces pcs per 100 pcs | Curled pieces pcs per 100 | Corrosiveness |
| --- | --- | --- | --- | --- | --- | --- |
| Example 1 | 0.05 | 0 | 0 | 0 | 0 | Unchanged |
| Example 2 | 0.38 | 0 | 0 | 0 | 0 | Unchanged |
| Example 3 | 1.3 | 0 | 0 | 0 | 0 | Unchanged |
| Example 4 | 0.39 | 0 | 0 | 0 | 3 | Unchanged |
| Comparative Example 1 | 0.01 (Mirror surface) | 5 | 12 | 0 | 10 | Unchanged |
| Comparative Example 2 | 1.8 | 28 | 0 | 17 | 0 | Unchanged |

TABLE 1-continued

|  | Top surfaces of salients Ra (μm) | Slippage pcs per 100 pcs | Adhered piecs pcs per 100 pcs | Damaged pieces pcs per 100 pcs | Curled pieces pcs per 100 | Corrosiveness |
|---|---|---|---|---|---|---|
| Comparative Example 3 | not ground | 47 | 0 | 35 | 0 | Unchanged |
| Comparative Example 4 | blast finishing | 0 | 0 | 0 | 12 | Corrosion in part found |

As clearly understood from the above Table 1, the numbers of rejection cases of slippage, adhering, and curling semiconductor wafers in Examples 1 through 4 are less frequent as compared to those in Comparative Tests 1 through 4 to prove that the semiconductor wafer treatment members have excellent required corrosion resistance.

Those having a surface roughness Ra of 3 μm or more at the surfaces in the depressions in Examples 1 through 3 show particularly excellent corrosion resistance among the Examples.

As stated above, the present invention provides a semiconductor wafer treatment member having a particularly excellent corrosion resistance because cases of semiconductor wafer slippage is restrained while giving an adequate close adhesion to the semiconductor wafer.

It is to be noted that the semiconductor wafer treatment member according to the present invention may be used for an element for a semiconductor treatment jig such as the wafer board or susceptor. The member used particularly as a susceptor may be preferably used for MO-CVD susceptor, or Argon annealing susceptor.

What is claimed is:

1. A semiconductor wafer treatment member having at least a surface formed with a silicon carbide (SiC) film thereon, comprising a support portion for supporting a semiconductor wafer, said support portion being composed of salients with which said semiconductor wafer substantially comes into contact; and depressions formed with the silicon carbide (SiC) film to provide a coverage area between said salients, said salients being formed with upper surfaces having a surface roughness Ra of 0.05 μm to 1.3 μm, and wherein said depressions have surfaces having a surface roughness Ra of 3 μm or more when measured for a length of 300 μm.

2. The semiconductor wafer treatment member as set forth in claim 1, wherein said coverage area has a ratio of 20 to 90% to a total area of said depressions.

3. The semiconductor wafer treatment member as set forth in claim 1, wherein said upper surfaces of the salients and said surfaces of the depressions have boundary portions in the form of curves.

4. The semiconductor wafer treatment member as set forth in claim 1, wherein boundary portions connecting said upper surfaces of the salients and said surfaces of the depressions are in the form of curves.

5. The semiconductor wafer treatment member as set forth in claim 2, wherein said upper surfaces of the salients and said surfaces of the depressions have boundary portions in the form of curves.

* * * * *